(12) United States Patent
Iwahori (10) Patent No.: US 12,249,637 B2
(45) Date of Patent: Mar. 11, 2025

(54) SEMICONDUCTOR INTEGRATED CIRCUIT DEVICE

(71) Applicant: Socionext Inc., Kanagawa (JP)

(72) Inventor: Junji Iwahori, Yokohama (JP)

(73) Assignee: SOCIONEXT INC., Kanagawa (JP)

(*) Notice: Subject to any disclaimer, the term of this patent is extended or adjusted under 35 U.S.C. 154(b) by 596 days.

(21) Appl. No.: 17/706,177

(22) Filed: Mar. 28, 2022

(65) Prior Publication Data

US 2022/0216319 A1    Jul. 7, 2022

Related U.S. Application Data

(63) Continuation of application No. PCT/JP2020/039062, filed on Oct. 16, 2020.

(30) Foreign Application Priority Data

Oct. 18, 2019    (JP) .................................. 2019-191324

(51) Int. Cl.
  *H01L 21/00*    (2006.01)
  *H01L 27/092*   (2006.01)
  (Continued)

(52) U.S. Cl.
  CPC ...... *H01L 29/42392* (2013.01); *H01L 27/092* (2013.01); *H01L 29/0665* (2013.01); *H01L 29/78696* (2013.01)

(58) Field of Classification Search
  CPC ............. H01L 29/42392; H01L 27/092; H01L 29/0665
  See application file for complete search history.

(56) References Cited

U.S. PATENT DOCUMENTS 9,853,024 B2 * 12/2017 Senoo ................. H01L 29/872
11,444,079 B2 * 9/2022 Tanaka ................. H01L 29/868
(Continued)

FOREIGN PATENT DOCUMENTS

WO     2018/030107 A1    2/2018
WO     WO-2021048995 A1 * 3/2021    ........ H01J 37/32082
(Continued)

OTHER PUBLICATIONS

Notice of Reasons for Refusal dated Oct. 15, 2024 issued in the corresponding Japanese Patent Application No. 2021-552462, with partial English translation.
(Continued)

*Primary Examiner* — Laura M Menz
(74) *Attorney, Agent, or Firm* — Rimon P.C.

(57) ABSTRACT

In a p-type region, a nanosheet farthest from an n-type region has a face exposed from a first gate interconnect on the side away from the n-type region in the Y direction. In the n-type region, a nanosheet farthest from the p-type region has a face exposed from a second gate interconnect on the side away from the p-type region in the Y direction. In the p-type region, a nanosheet closest to the n-type region has a face exposed from the first gate interconnect on the side closer to the n-type region in the Y direction. In the n-type region, a nanosheet closest to the p-type region has a face exposed from the second gate interconnect on the side closer to the p-type region in the Y direction.

7 Claims, 10 Drawing Sheets

(51) Int. Cl.
  *H01L 29/06* (2006.01)
  *H01L 29/423* (2006.01)
  *H01L 29/786* (2006.01)

(56) References Cited

U.S. PATENT DOCUMENTS

| | | | | |
|---|---|---|---|---|
| 11,563,432 | B2* | 1/2023 | Okamoto | H03K 17/161 |
| 11,799,471 | B2* | 10/2023 | Okamoto | H03K 17/161 |
| 11,855,078 | B2* | 12/2023 | Chen | H01L 21/823481 |
| 12,002,808 | B2* | 6/2024 | Xie | H01L 29/0673 |
| 12,048,134 | B2* | 7/2024 | Hirose | H01L 29/775 |
| 12,062,694 | B2* | 8/2024 | Iwahori | H01L 29/775 |
| 12,094,781 | B2* | 9/2024 | Miura | H01J 37/3244 |
| 12,094,882 | B2* | 9/2024 | Komuro | H01L 23/535 |
| 12,142,606 | B2* | 11/2024 | Iwahori | H01L 29/0673 |
| 12,170,322 | B2* | 12/2024 | Yim | H01L 29/0665 |
| 2013/0178043 | A1* | 7/2013 | Cheng | H10B 12/05 257/E21.214 |
| 2014/0001564 | A1* | 1/2014 | Song | G06F 30/00 716/112 |
| 2014/0124868 | A1* | 5/2014 | Kamal | H01L 27/11807 257/369 |
| 2016/0118480 | A1* | 4/2016 | Xie | H01L 21/823431 438/157 |
| 2017/0033102 | A1* | 2/2017 | Kim | H01L 27/0207 |
| 2018/0026042 | A1* | 1/2018 | Smith | H01L 27/0688 257/390 |
| 2019/0123063 | A1* | 4/2019 | Hino | H01L 29/78696 |
| 2019/0164993 | A1* | 5/2019 | Shimbo | H01L 27/11807 |
| 2019/0172841 | A1* | 6/2019 | Kishishita | H01L 29/775 |
| 2019/0198530 | A1* | 6/2019 | Hino | H01L 27/0629 |
| 2020/0126987 | A1* | 4/2020 | Rubin | H01L 29/0847 |
| 2020/0335488 | A1* | 10/2020 | Iwahori | H01L 28/90 |
| 2020/0381426 | A1* | 12/2020 | Xu | H01L 27/088 |
| 2020/0388615 | A1* | 12/2020 | Tanaka | H01L 29/0673 |
| 2021/0020644 | A1* | 1/2021 | Paul | H01L 21/28123 |
| 2021/0028191 | A1* | 1/2021 | Hino | H01L 29/42392 |
| 2021/0057281 | A1* | 2/2021 | Liaw | H01L 29/66439 |
| 2021/0066291 | A1* | 3/2021 | Lin | H01L 29/42384 |
| 2021/0082766 | A1* | 3/2021 | Miura | H01L 21/823431 |
| 2021/0358911 | A1* | 11/2021 | Zhang | H01L 29/775 |
| 2022/0216319 | A1* | 7/2022 | Iwahori | H01L 27/0207 |
| 2022/0223588 | A1* | 7/2022 | Iwahori | H01L 21/823412 |
| 2022/0231053 | A1* | 7/2022 | Takeno | H01L 27/11807 |
| 2022/0231681 | A1* | 7/2022 | Okamoto | H03K 17/6871 |
| 2022/0246644 | A1* | 8/2022 | Nakaoka | H01L 27/0207 |
| 2022/0310631 | A1* | 9/2022 | Hirose | H01L 29/0665 |
| 2022/0310634 | A1* | 9/2022 | Sakai | H01L 29/42392 |
| 2022/0328477 | A1* | 10/2022 | Chen | H01L 21/823456 |
| 2022/0336499 | A1* | 10/2022 | Komuro | H01L 27/11807 |
| 2022/0359541 | A1* | 11/2022 | Yamagami | H01L 29/786 |
| 2022/0375945 | A1* | 11/2022 | Hirose | H01L 29/775 |
| 2022/0392999 | A1* | 12/2022 | Iwahori | H01L 29/0673 |
| 2022/0415885 | A1* | 12/2022 | Sobue | H01L 29/775 |
| 2023/0038116 | A1* | 2/2023 | Xie | H01L 27/092 |
| 2023/0053433 | A1* | 2/2023 | Serizawa | H01L 27/0688 |
| 2023/0061555 | A1* | 3/2023 | Chen | H01L 29/78696 |
| 2023/0120959 | A1* | 4/2023 | Okamoto | H03K 19/0013 327/382 |
| 2023/0207553 | A1* | 6/2023 | Xie | H01L 23/5286 |
| 2023/0207563 | A1* | 6/2023 | Cheng | H01L 29/0665 257/351 |
| 2023/0262970 | A1* | 8/2023 | Yamada | H10B 20/25 257/350 |
| 2023/0290785 | A1* | 9/2023 | Hino | H01L 27/0207 |
| 2023/0411246 | A1* | 12/2023 | Komuro | H01L 21/823431 |
| 2023/0411379 | A1* | 12/2023 | Komuro | H01L 27/0924 |
| 2024/0072058 | A1* | 2/2024 | Sobue | H01L 23/5286 |
| 2024/0081035 | A1* | 3/2024 | Hirose | H01L 21/3205 |
| 2024/0113124 | A1* | 4/2024 | Hino | H01L 21/823828 |
| 2024/0162227 | A1* | 5/2024 | Chen | H01L 29/66439 |
| 2024/0170331 | A1* | 5/2024 | Kang | H01L 29/0653 |
| 2024/0234322 | A1* | 7/2024 | Shinohara | H01L 21/82 |
| 2024/0250140 | A1* | 7/2024 | Bhuwalka | H01L 29/78696 |
| 2024/0304629 | A1* | 9/2024 | Hino | H01L 27/0207 |
| 2024/0321886 | A1* | 9/2024 | Cho | H01L 29/0673 |
| 2024/0341074 | A1* | 10/2024 | Hirose | H01L 29/0673 |
| 2024/0363521 | A1* | 10/2024 | Komuro | H01L 21/82 |
| 2024/0363686 | A1* | 10/2024 | Iwahori | H01L 23/5286 |
| 2024/0395709 | A1* | 11/2024 | Sakai | G11C 17/12 |
| 2024/0397696 | A1* | 11/2024 | Hirose | H01L 27/0207 |
| 2024/0421148 | A1* | 12/2024 | Sobue | H01L 27/06 |

FOREIGN PATENT DOCUMENTS

| | | | | |
|---|---|---|---|---|
| WO | WO-2021075434 A1 * | 4/2021 | | H01L 27/11807 |
| WO | WO-2021075540 A1 * | 4/2021 | | H01L 27/092 |
| WO | WO-2021171969 A1 * | 9/2021 | | G11C 11/412 |
| WO | WO-2022258151 A1 * | 12/2022 | | H01L 21/823807 |
| WO | WO-2023041527 A1 * | 3/2023 | | H01L 27/0296 |
| WO | WO-2023126710 A1 * | 7/2023 | | H01L 21/76229 |
| WO | WO-2024135324 A1 * | 6/2024 | | |
| WO | WO-2024162046 A1 * | 8/2024 | | |
| WO | WO-2024162047 A1 * | 8/2024 | | |
| WO | WO-2024162070 A1 * | 8/2024 | | |

OTHER PUBLICATIONS

International Search Report (ISR) dated Dec. 28, 2020 issued in International Patent Application No. PCT/JP2020/039062, with English translation.

P. Weckx et al., "Stacked nanosheet fork architecture for SRAM design and device co-optimization toward 3 nm", 2017 IEEE International Electron Devices Meeting (IEDM), Dec. 5, 2017, cited in the ISR of PCT/JP2020/039062, pp. 505-508.

P. Weckx et al., "Novel forksheet device architecture as ultimate logic scaling device towards 2nm", 2019 IEEE International Electron Devices Meeting (IEDM), Dec. 11, 2019, cited in the ISR of PCT/JP2020/039062, pp. 871-874.

* cited by examiner

SEMICONDUCTOR INTEGRATED CIRCUIT DEVICE

CROSS-REFERENCE TO RELATED APPLICATIONS

This is a continuation of International Application No. PCT/JP2020/039062 filed on Oct. 16, 2020, which claims priority to Japanese Patent Application No. 2019-191324 filed on Oct. 18, 2019. The entire disclosures of these applications are incorporated by reference herein.

BACKGROUND

The present disclosure relates to a semiconductor integrated circuit device provided with nanosheet (nanowire) field effect transistors (FETs).

As a method for forming a semiconductor integrated circuit on a semiconductor substrate, a standard cell method is known. The standard cell method is a method in which basic units (e.g., inverters, latches, flipflops, and full adders) having specific logical functions are prepared in advance as standard cells, and a plurality of such standard cells are placed on a semiconductor substrate and connected through interconnects, thereby designing an LSI chip.

As for transistors as basic constituents of an LSI, improvement in integration degree, reduction in operating voltage, and improvement in operating speed have been achieved thanks to scaling of the gate length. Recently, however, increase in off current due to excessive scaling and the resulting significant increase in power consumption have raised a problem. To solve this problem, three-dimensional transistors having a three-dimensional structure changed from the conventional planar structure have been vigorously studied. As one type of such three-dimensional transistors, nanosheet (nanowire) FETs have received attention.

P. Weckx et al., "Stacked nanosheet fork architecture for SRAM design and device co-optimization toward 3 nm," 2017 IEEE International Electron Devices Meeting (IEDM), December 2017, IEDM17-505-508 discloses a layout of an SRAM memory cell using nanosheet FETs where the gate electrode is shaped like a fork.

Note that the nanosheet FET having a fork-shaped gate electrode is hereinafter called a forksheet FET following the prior art.

Thus far, there have been no documents that disclose a layout structure of a standard cell using forksheet FETs nor a layout of a semiconductor integrated circuit using forksheet FETs.

An objective of the present disclosure is providing a small-area layout structure of a semiconductor integrated circuit device using forksheet FETs.

SUMMARY

According to the first mode of the present disclosure, a semiconductor integrated circuit device includes standard cells arranged in a first direction, in each of the standard cells, a p-type region in which p-type transistors are formed and an n-type region in which n-type transistors are formed being disposed adjacently in a second direction vertical to the first direction, the standard cell including: a first nanosheet group including two or more nanosheets, each extending in the first direction, arranged in the second direction in the p-type region; a second nanosheet group including two or more nanosheets, each extending in the first direction, arranged in the second direction in the n-type region; a first gate interconnect extending in the second direction, formed to surround peripheries of the nanosheets of the first nanosheet group in the second direction and a third direction perpendicular to the first and second directions; and a second gate interconnect extending in the second direction, formed to surround peripheries of the nanosheets of the second nanosheet group in the second and third directions, wherein in the first nanosheet group, a first nanosheet farthest from the n-type region has a face exposed from the first gate interconnect on a side away from the n-type region in the second direction, and a second nanosheet closest to the n-type region has a face exposed from the first gate interconnect on a side closer to the n-type region in the second direction, and in the second nanosheet group, a third nanosheet farthest from the p-type region has a face exposed from the second gate interconnect on a side away from the p-type region in the second direction, and a fourth nanosheet closest to the p-type region has a face exposed from the second gate interconnect on a side closer to the p-type region in the second direction.

According to the above mode, in the first nanosheet group in the p-type region, the first nanosheet farthest from the n-type region has a face exposed from the first gate interconnect on the side away from the n-type region in the second direction. In the second nanosheet group in the n-type region, the third nanosheet farthest from the p-type region has a face exposed from the second gate interconnect on the side away from the p-type region in the second direction. That is, the first gate interconnect does not protrude from the first nanosheet group toward the outside of the standard cell, and the second gate interconnect does not protrude from the second nanosheet group toward the outside of the standard cell. Also, in the first nanosheet group in the p-type region, the second nanosheet closest to the n-type region has a face exposed from the first gate interconnect on the side closer to the n-type region in the second direction. In the second nanosheet group in the n-type region, the fourth nanosheet closest to the p-type region has a face exposed from the second gate interconnect on the side closer to the p-type region in the second direction. That is, the first gate interconnect does not protrude from the first nanosheet group toward the second nanosheet group, and the second gate interconnect does not protrude from the second nanosheet group toward the first nanosheet group. This can reduce the size in the second direction of the standard cell, whereby a small-area layout structure can be achieved.

According to the second mode of the present disclosure, a semiconductor integrated circuit device includes: a first power line extending in a first direction for supplying a first power supply voltage; and a second power line extending in the first direction for supplying a second power supply voltage, a p-type region in which p-type transistors are formed and an n-type region in which n-type transistors are formed being disposed adjacently in a second direction vertical to the first direction between the first and second power lines, the device further including: a first nanosheet group including two or more nanosheets, each extending in the first direction, arranged in the second direction in the p-type region; a second nanosheet group including two or more nanosheets, each extending in the first direction, arranged in the second direction in the n-type region; a first gate interconnect extending in the second direction, formed to surround peripheries of the nanosheets of the first nanosheet group in the second direction and a third direction perpendicular to the first and second directions; and a second gate interconnect extending in the second direction, formed to surround peripheries of the nanosheets of the second nanosheet group in the second and third directions, wherein in the first nanosheet group, a first nanosheet farthest from the n-type region has a face exposed from the first gate interconnect on a side away from the n-type region in the second direction, and a second nanosheet closest to the n-type region has a face exposed from the first gate interconnect on a side closer to the n-type region in the second direction, and in the second nanosheet group, a third nanosheet farthest from the p-type region has a face exposed from the second gate interconnect on a side away from the p-type region in the second direction, and a fourth nanosheet closest to the p-type region has a face exposed from the second gate interconnect on a side closer to the p-type region in the second direction.

According to the above mode, in the first nanosheet group in the p-type region, the first nanosheet farthest from the n-type region has a face exposed from the first gate interconnect on the side away from the n-type region in the second direction. In the second nanosheet group in the n-type region, the third nanosheet farthest from the p-type region has a face exposed from the second gate interconnect on the side away from the p-type region in the second direction. That is, the first gate interconnect does not protrude from the first nanosheet group toward the power line side, and the second gate interconnect does not protrude from the second nanosheet group toward the power line side. Also, in the first nanosheet group in the p-type region, the second nanosheet closest to the n-type region has a face exposed from the first gate interconnect on the side closer to the n-type region in the second direction. In the second nanosheet group in the n-type region, the fourth nanosheet closest to the p-type region has a face exposed from the second gate interconnect on the side closer to the p-type region in the second direction. That is, the first gate interconnect does not protrude from the first nanosheet group toward the second nanosheet group, and the second gate interconnect does not protrude from the second nanosheet group toward the first nanosheet group. This can reduce the size in the second direction of the semiconductor integrated circuit device, whereby a small-area layout structure can be achieved.

According to the present disclosure, a small-area layout structure can be achieved for a semiconductor integrated circuit device using forksheet FETs.

DETAILED DESCRIPTION

An embodiment of the present disclosure will be described hereinafter with reference to the accompanying drawings. In the following embodiment, it is assumed that the semiconductor integrated circuit device includes a plurality of standard cells (hereinafter simply called cells as appropriate), and at least some of the standard cells include nanosheet field effect transistors (FETs). The nanosheet FET is a FET using a thin sheet (nanosheet) through which a current flows. Such a nanosheet is formed of silicon, for example. In the semiconductor integrated circuit device, it is assumed that some of the nanosheet FETs are forksheet FETs having a fork-shaped gate electrode.

Figure 1A:
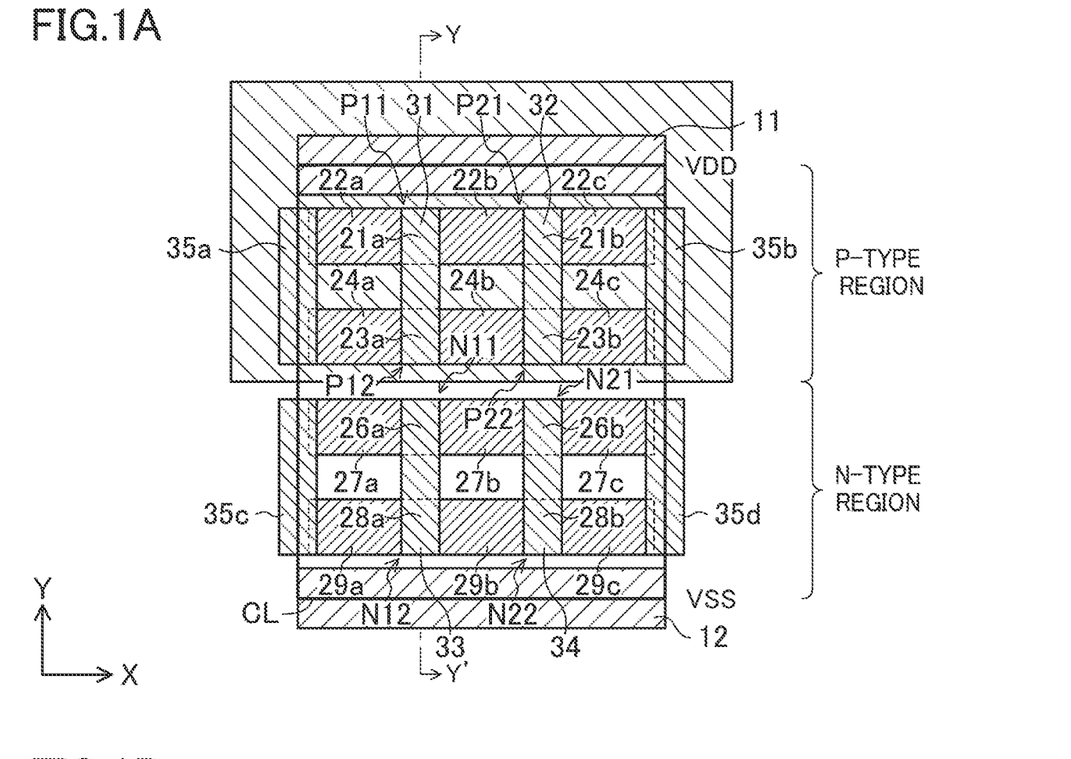
FIGS. 1A and 1B are a plan view and a cross-sectional view, respectively, showing an example of the basic structure of a standard cell having forksheet FETs according to an embodiment.

In the present disclosure, a semiconductor layer portion formed on each end of a nanosheet to constitute a terminal that is to be the source or drain of a nanosheet FET is called a "pad." Also, hereinafter, in the plan views such as FIG. 1, the horizontal direction is called an X direction (corresponding to the first direction), the vertical direction is called a Y direction (corresponding to the second direction), and the direction perpendicular to the substrate plane is called a Z direction (corresponding to the third direction).

First, the basic structure of the forksheet FET will be described.

Figure 10A:
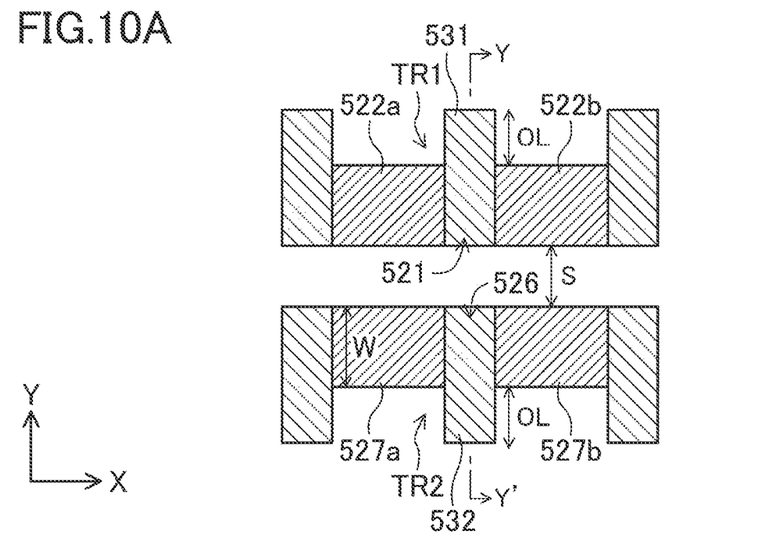
FIGS. 10A and 10B are a plan view and a cross-sectional view, respectively, showing a basic structure of a forksheet FET.
Figure 10B:
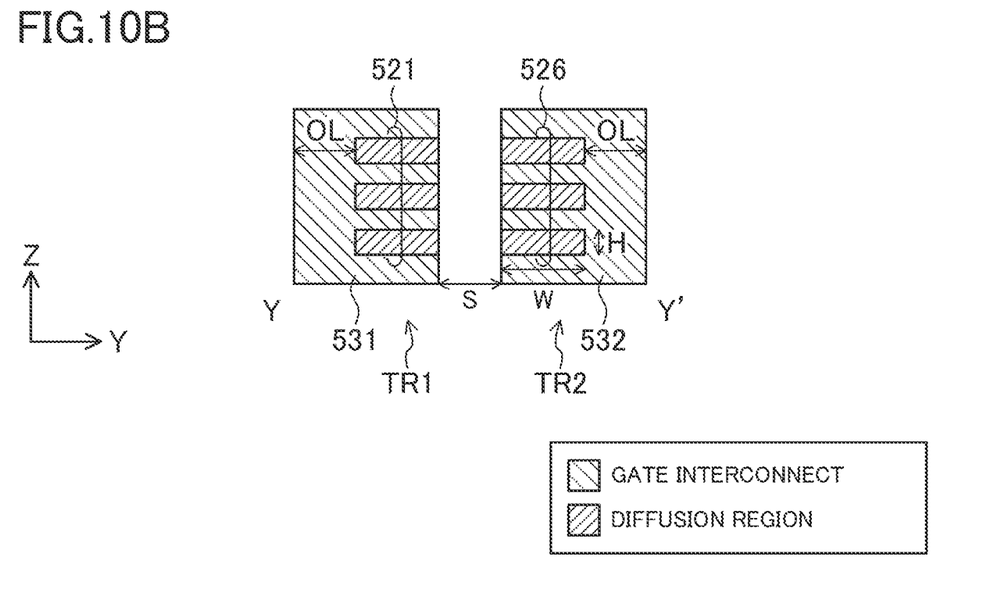

FIGS. 10A-10B are views showing a basic structure of a forksheet FET, where FIG. 10A is a plan view and FIG. 10B is a cross-sectional view taken along line Y-Y' in FIG. 10A. In the basic structure of FIGS. 10A-10B, two transistors TR1 and TR2 are placed side by side with space S between them in the Y direction. A gate interconnect 531 that is to be the gate of the transistor TR1 and a gate interconnect 532 that is to be the gate of the transistor TR2 extend in the Y direction and are at the same position in the X direction.

A channel portion 521 that is to be the channel region of the transistor TR1 and a channel portion 526 that is to be the channel region of the transistor TR2 are constituted by nanosheets. In FIGS. 10A-10B, the channel portions 521 and 526 are each constituted by three nanosheets overlapping one another as viewed in plan. Pads 522a and 522b that are to be the source and drain regions of the transistor TR1 are formed on both sides of the channel portion 521 in the X direction. Pads 527a and 527b that are to be the source and drain regions of the transistor TR2 are formed on both sides of the channel portion 526 in the X direction. The pads 522a and 522b are formed by epitaxial growth from the nanosheets constituting the channel portion 521. The pads 527a and 527b are formed by epitaxial growth from the nanosheets constituting the channel portion 526.

The gate interconnect 531 surrounds the peripheries of the nanosheets constituting the channel portion 521 in the Y and Z directions via a gate insulating film (not shown). Note however that the faces of the nanosheets constituting the channel portion 521 on the side closer to the transistor TR2 in the Y direction are exposed, not covered with the gate interconnect 531. That is, in the cross-sectional view of FIG. 10B, the gate interconnect 531 does not cover the right side faces of the nanosheets constituting the channel portion 521 but covers the upper, lower, and left side faces of the nanosheets. The gate interconnect 531 protrudes from the nanosheets constituting the channel portion 521 by a length OL toward the side away from the transistor TR2 in the Y direction.

The gate interconnect 532 surrounds the peripheries of the nanosheets constituting the channel portion 526 in the Y and Z directions via a gate insulating film (not shown). Note however that the faces of the nanosheets constituting the channel portion 526 on the side closer to the transistor TR1 in the Y direction are exposed, not covered with the gate interconnect 532. That is, in the cross-sectional view of FIG. 10B, the gate interconnect 532 does not cover the left side faces of the nanosheets constituting the channel portion 526 but covers the upper, lower, and right side faces of the nanosheets. The gate interconnect 532 protrudes from the nanosheets constituting the channel portion 526 by a length OL toward the side away from the transistor TR1 in the Y direction.

Here, the gate effective width Weff of each nanosheet is represented by $$Weff = 2 \times W + H$$

where W is the width (size in the Y direction) of the nanosheet, and H is the height (size in the Z direction) thereof. Since the channel portions 521 and 526 of the transistors TR1 and TR2 are each constituted by three nanosheets, the gate effective width of each of the transistors TR1 and TR2 is $$3 \times (2 \times W + H).$$

In the structure of FIGS. 10A-10B, the gate interconnect 531 does not protrude from the nanosheets constituting the channel portion 521 toward the transistor TR2 in the Y direction. Also, the gate interconnect 532 does not protrude from the nanosheets constituting the channel portion 526 toward the transistor TR1 in the Y direction. This can bring the transistors TR1 and TR2 closer to each other and thus achieve area reduction.

The number of nanosheets constituting the channel portion of each transistor is not limited to three. The channel portion may be constituted by one nanosheet, or may be constituted by a plurality of nanosheets overlapping each other as viewed in plan. Also, while the cross-sectional shape of the nanosheets is illustrated as rectangular in FIG. 10B, it is not limited to this. For example, the shape may be square, circular, or oval.

The semiconductor integrated circuit device may include both forksheet FETs and nanosheet FETs where a gate interconnect surrounds the entire peripheries of nanosheets, in a mixed manner.

As used herein, "VDD" and "VSS" refer to the power supply voltages or the power supplies themselves. Also, as used herein, an expression indicating that widths, etc. are identical, such as the "same wiring width," is to be understood as including a range of manufacturing variations.

Embodiment

Figure 1B:
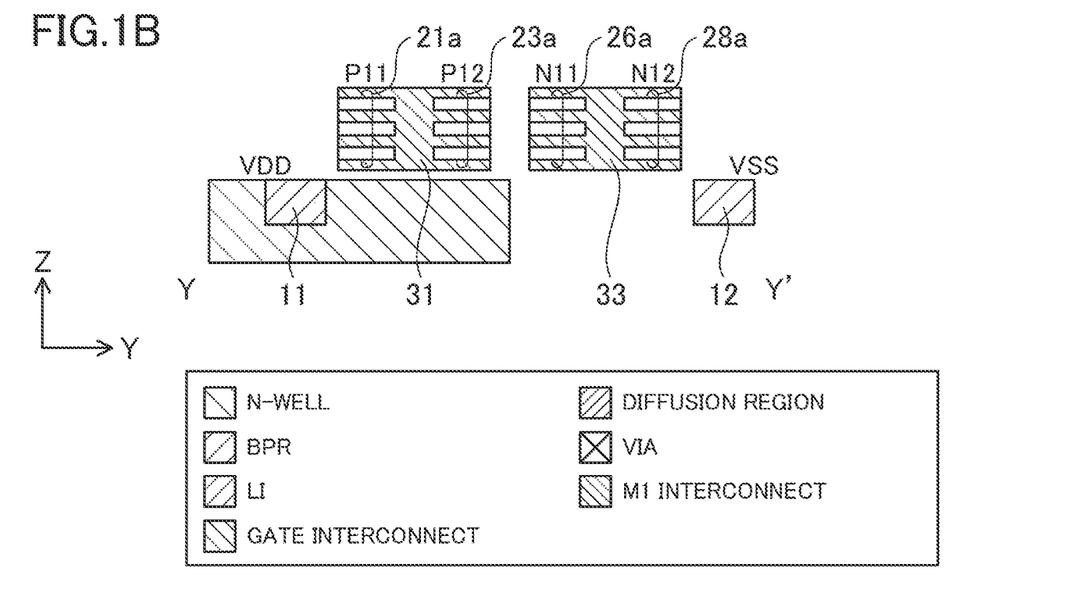

FIGS. 1A-1B are views showing a basic structure of a standard cell having forksheet FETs according to the embodiment, where FIG. 1A is a plan view and FIG. 1B is a cross-sectional view taken along line Y-Y' in FIG. 1A. In FIG. 1A, CL defines the cell bounds of the standard cell, which also applies to the subsequent plan views.

The standard cell of FIGS. 1A-1B and other standard cells are arranged in the X direction with the cell bounds CL of adjacent standard cells touching each other, forming a cell row. A plurality of such cell rows are arranged in the Y direction with the cell bounds CL of standard cells in adjacent cell rows touching each other. Note that these cell rows are inverted vertically every other row.

As shown in FIGS. 1A-1B, a power line 11 and a power line 12 extending in the X direction are formed on opposite ends of the standard cell in the Y direction. The power lines 11 and 12 are both buried power rails (BPRs) formed in a buried interconnect layer. The power line 11 supplies the power supply voltage VDD and the power line 12 supplies the power supply voltage VSS. The power lines 11 and 12 are shared by other cells arranged in line in the X direction, forming power lines extending between adjacent cell rows.

P-type transistors P11, P12, P21, and P22 are formed in a p-type region on an N-well, and n-type transistors N11, N12, N21, and N22 are formed in an n-type region on a P-substrate. The transistors P11, P12, N11, and N12 are arranged in line in the Y direction, and the transistors P21, P22, N21, and N22 are arranged in line in the Y direction.

The transistors P11, P12, P21, and P22 have nanosheets 21a, 23a, 21b, and 23b, respectively, each formed of three sheets, as their channel portions. That is, the transistors P11, P12, P21, and P22 are nanosheet FETs.

As shown in FIG. 1A, pads 22a, 22b, and 22c each made of an integral semiconductor layer connected to three sheets are formed on the left side of the nanosheets 21a, between the nanosheets 21a and 21b, and on the right side of the nanosheets 21b, respectively, as viewed in the figure. The pads 22a and 22b are to be the source and drain regions of the transistor P11, and the pads 22b and 22c are to be the source and drain regions of the transistor P21.

Pads 24a, 24b, and 24c each made of an integral semiconductor layer connected to three sheets are formed on the left side of the nanosheets 23a, between the nanosheets 23a and 23b, and on the right side of the nanosheets 23b, respectively, as viewed in the figure. The pads 24a and 24b are to be the source and drain regions of the transistor P12, and the pads 24b and 24c are to be the source and drain regions of the transistor P22.

The transistors N11, N12, N21, and N22 have nanosheets 26a, 28a, 26b, and 28b, respectively, each made of three sheets, as their channel portions. That is, the transistors N11, N12, N21, and N22 are nanosheet FETs.

As shown in FIG. 1A, pads 27a, 27b, and 27c each made of an integral semiconductor layer connected to three sheets are formed on the left side of the nanosheets 26a, between the nanosheets 26a and 26b, and on the right side of the nanosheets 26b, respectively, as viewed in the figure. The pads 27a and 27b are to be the source and drain regions of the transistor N11, and the pads 27b and 27c are to be the source and drain regions of the transistor N21.

Pads 29a, 29b, and 29c each made of an integral semiconductor layer connected to three sheets are formed on the left side of the nanosheets 28a, between the nanosheets 28a and 28b, and on the right side of the nanosheets 28b, respectively, as viewed in the figure. The pads 29a and 29b are to be the source and drain regions of the transistor N12, and the pads 29b and 29c are to be the source and drain regions of the transistor N22.

Gate interconnects 31 and 32 extending in parallel in the Y direction are formed in the p-type region. Dummy gate interconnects 35a and 35b are formed over the cell bounds CL on both sides of the gate interconnects 31 and 32 in the X direction. The gate interconnects 31 and 32 and the dummy gate interconnects 35a and 35b, having the same width, are placed at the same pitch.

Gate interconnects 33 and 34 extending in parallel in the Y direction are formed in the n-type region. Dummy gate interconnects 35c and 35d are formed over the cell bounds CL on both sides of the gate interconnects 33 and 34 in the X direction. The gate interconnects 33 and 34 and the dummy gate interconnects 35c and 35d, having the same width, are placed at the same pitch.

The gate interconnect 31 surrounds the peripheries of the nanosheets 21a of the transistor P11 and the nanosheets 23a of the transistor P12 in the Y and Z directions via a gate insulating film (not shown). The gate interconnect 31 is to be the gates of the transistors P11 and P12. The gate interconnect 32 surrounds the peripheries of the nanosheets 21b of the transistor P21 and the nanosheets 23b of the transistor P22 in the Y and Z directions via a gate insulating film (not shown). The gate interconnect 32 is to be the gates of the transistors P21 and P22.

The gate interconnect 33 surrounds the peripheries of the nanosheets 26a of the transistor N11 and the nanosheets 28a of the transistor N12 in the Y and Z directions via a gate insulating film (not shown). The gate interconnect 33 is to be the gates of the transistors N11 and N12. The gate interconnect 34 surrounds the peripheries of the nanosheets 26b of the transistor N21 and the nanosheets 28b of the transistor N22 in the Y and Z directions via a gate insulating film (not shown). The gate interconnect 34 is to be the gates of the transistors N21 and N22.

Here, the faces of the nanosheets 21a and 21b on the side away from the n-type region in the Y direction (the side closer to the power line 11) are exposed, not covered with the gate interconnects 31 and 32. The faces of the nanosheets 23a and 23b on the side closer to the n-type region in the Y direction are exposed, not covered with the gate interconnects 31 and 32. For example, the nanosheets 21a and 23a constitute the first nanosheet group, in which the nanosheets 21a correspond to the first nanosheet farthest from the n-type region and the nanosheets 23a correspond to the second nanosheet closest to the n-type region.

Also, the faces of the nanosheets 26a and 26b on the side closer to the p-type region in the Y direction are exposed, not covered with the gate interconnects 33 and 34. The faces of the nanosheets 28a and 28b on the side away from the p-type region in the Y direction (the side closer to the power line 12) are exposed, not covered with the gate interconnects 33 and 34. For example, the nanosheets 26a and 28a constitute the second nanosheet group, in which the nanosheets 28a correspond to the third nanosheet farthest from the P-type region and the nanosheets 26a correspond to the fourth nanosheet closest to the p-type region.

Based on such a basic structure, vias and interconnects (local interconnects and metal interconnects) for connection between transistors are formed, whereby a standard cell implementing a logical function is provided.

While the power lines 11 and 12 are buried power rails in this embodiment, the configuration is not limited to this. For example, the power lines may be formed in an upper metal interconnect layer.

Also, while each two transistors are arranged in the X direction in this embodiment, the configuration is not limited to this. For example, only one transistor may be placed in the X direction, or three or more transistors may be placed in the X direction.

Examples of standard cells implementing a logical function, formed based on the basic structure described above, will be described hereinafter.

Example 1: 2-Input NAND

Figure 2A:
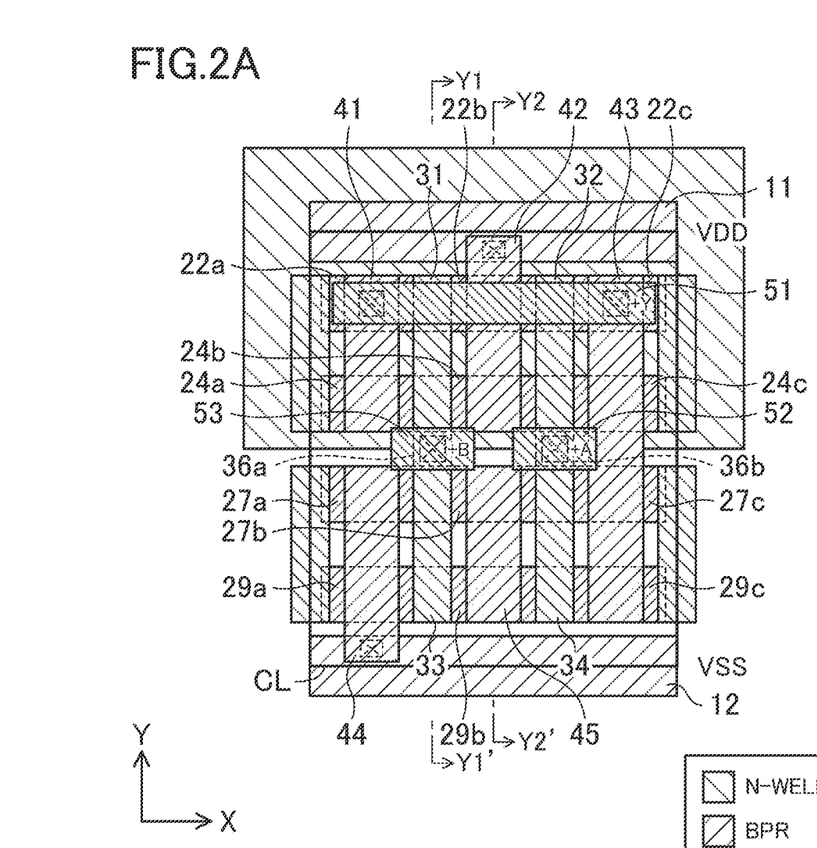
FIG. 2A is a plan view showing a layout structure of a 2-input NAND cell.
Figure 2B:
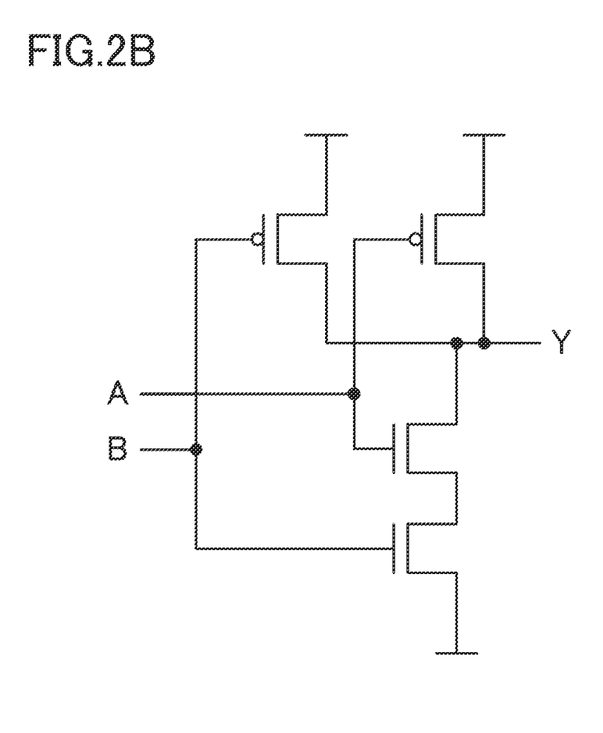
FIG. 2B is a circuit diagram of a 2-input NAND.
Figure 3A:
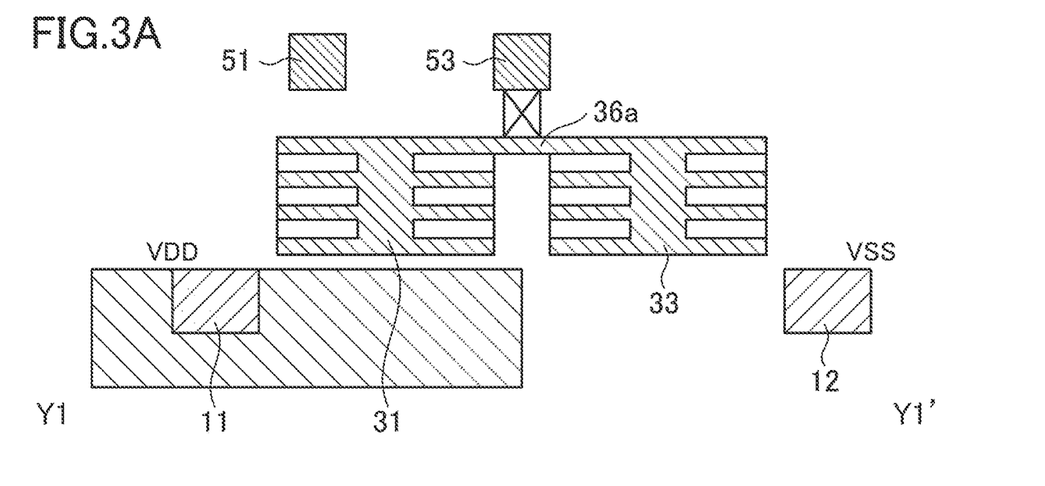
FIGS. 3A and 3B are cross-sectional views of the 2-input NAND cell of FIG. 2A.
Figure 3B:
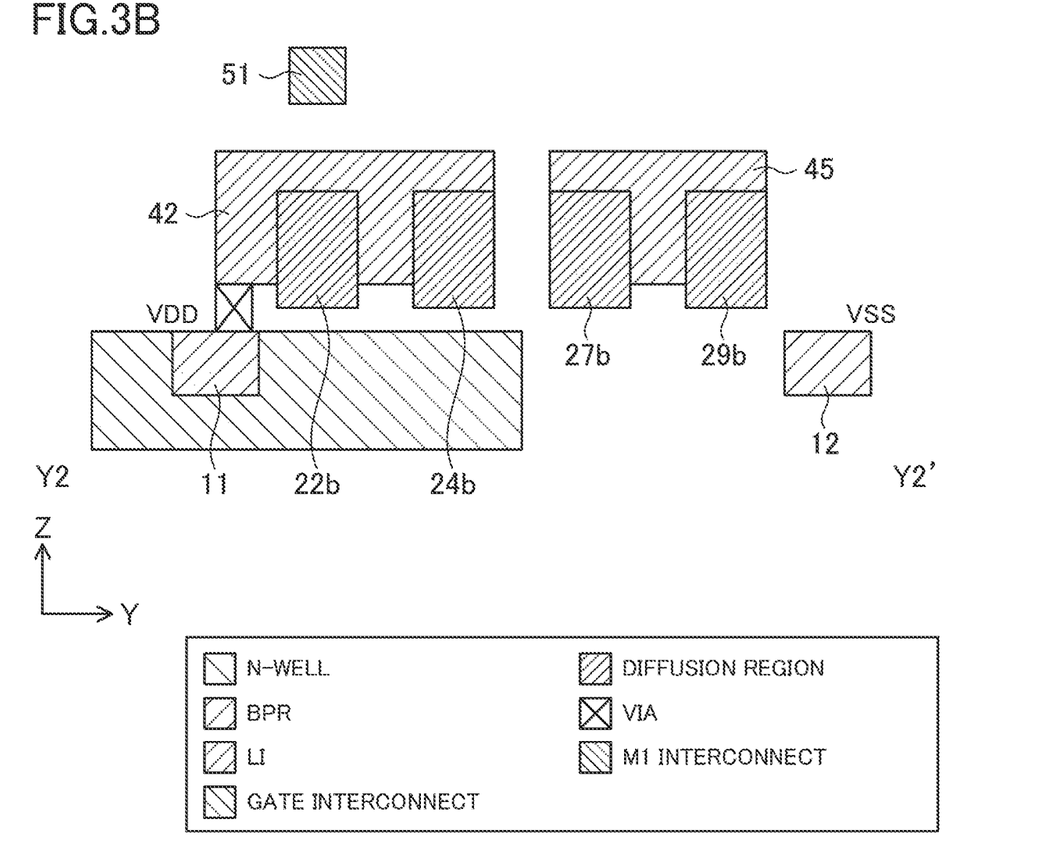

FIG. 2A is a plan view showing a layout structure of a 2-input NAND cell, FIG. 2B is a circuit diagram of a 2-input NAND, FIG. 3A is a cross-sectional view taken along line Y1-Y1' in FIG. 2A, and FIG. 3B is a cross-sectional view taken along line Y2-Y2' in FIG. 2A.

Local interconnects 41, 42, 43, 44, and 45 extending in the Y direction are formed in a local interconnect layer. The local interconnect 41 is connected with the pads 22a and 24a. The local interconnect 42 is connected with the pads 22b and 24b and also connected with the power line 11 through a via. The local interconnect 43 is connected with the pads 22c, 24c, 27c, and 29c. The local interconnect 44 is connected with the pads 27a and 29a and also connected with the power line 12 through a via. The local interconnect 45 is connected with the pads 27b and 29b.

The gate interconnects 31 and 33 arranged in line in the Y direction are mutually connected through a bridge 36a formed between them. The gate interconnects 32 and 34 arranged in line in the Y direction are mutually connected through a bridge 36b formed between them. The bridges 36a and 36b are an example of gate connecting portions.

Metal interconnects 51, 52, and 53 extending in the X direction are formed in an M1 interconnect layer. The metal interconnect 51 is connected with the local interconnects 41 and 43 through vias. The metal interconnect 52 is connected with the gate interconnects 32 and 34 through a via, and the metal interconnect 53 is connected with the gate interconnects 31 and 33 through a via. The metal interconnects 51, 52, and 53 correspond to output Y and inputs A and B, respectively, of the 2-input NAND.

Example 2: Tristate Inverter

Figure 4A:
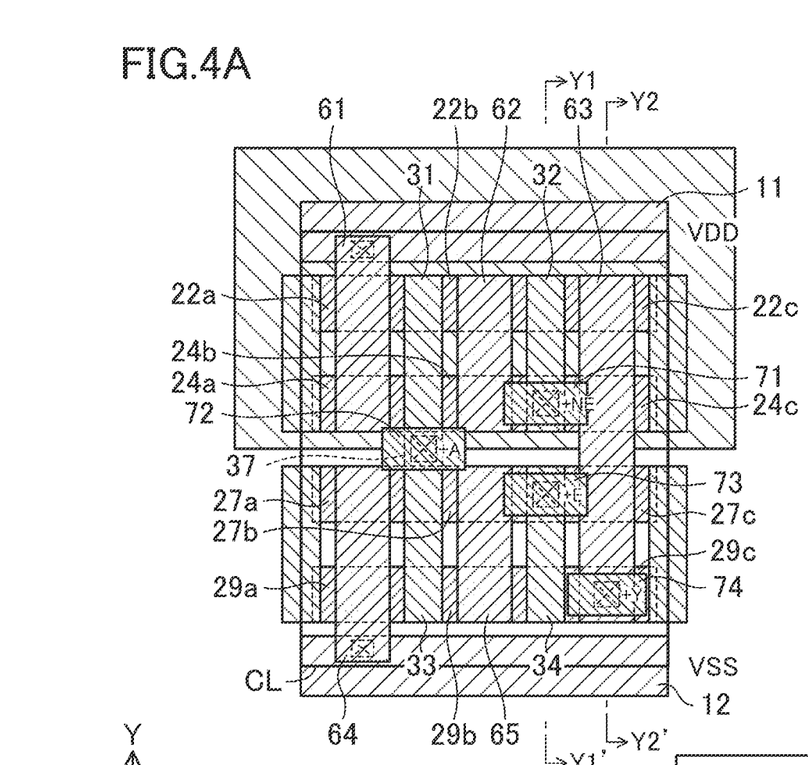
FIG. 4A is a plan view showing a layout structure of a tristate inverter cell.
Figure 4B:
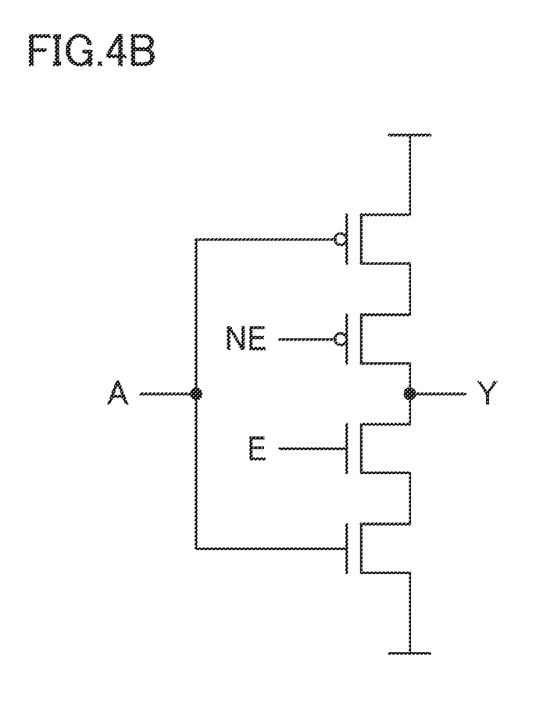
FIG. 4B is a circuit diagram of a tristate inverter.
Figure 5A:
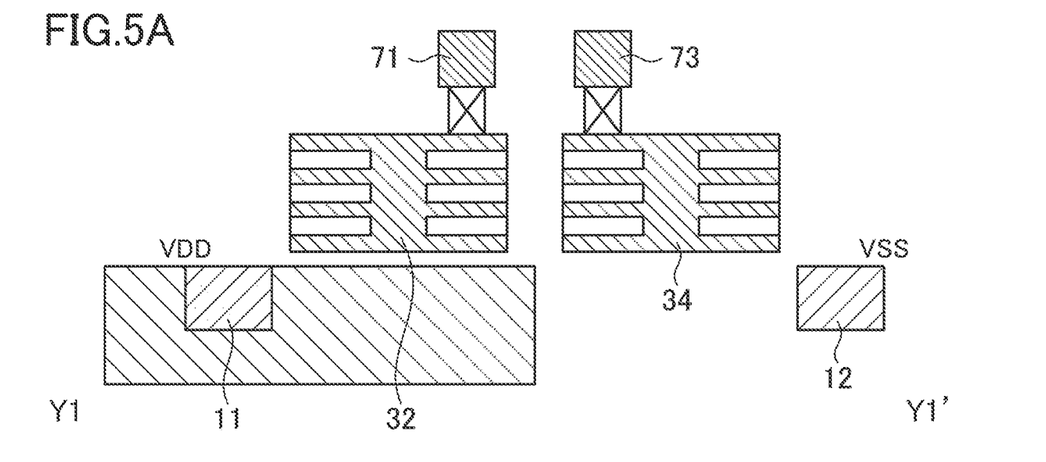
FIGS. 5A and 5B are cross-sectional views of the tristate inverter cell of FIG. 4A.
Figure 5B:
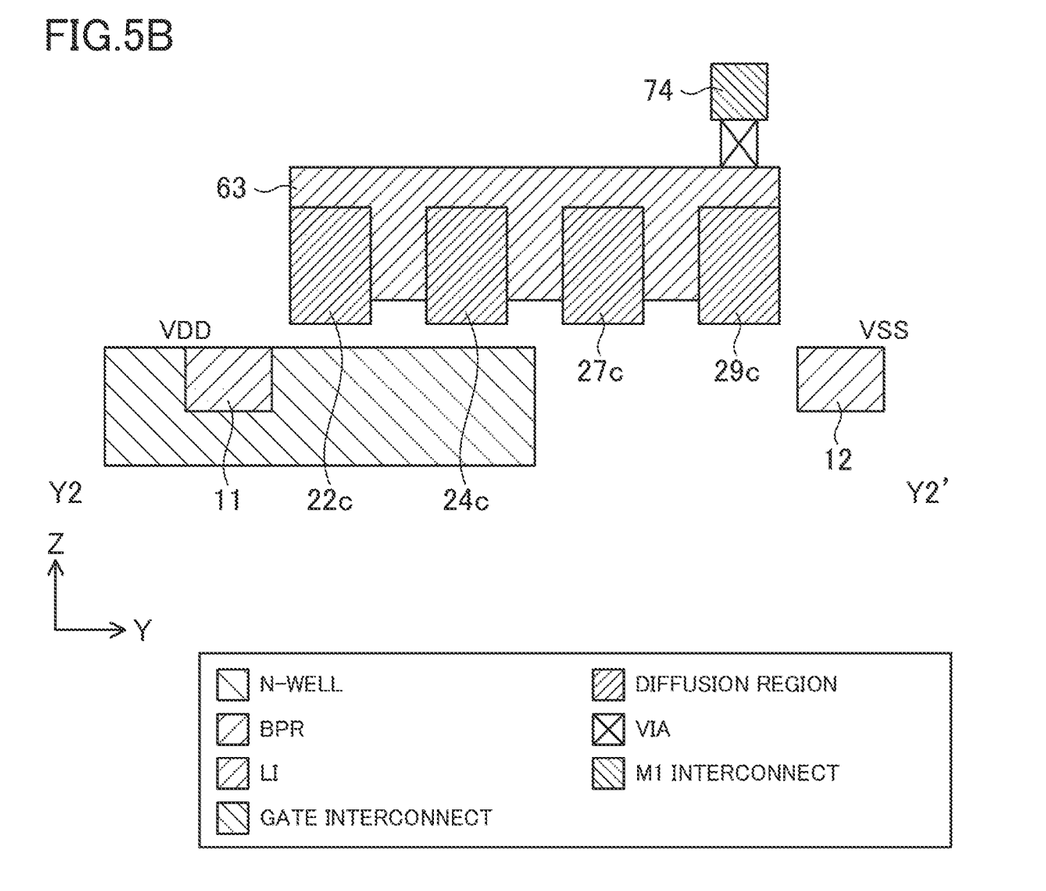

FIG. 4A is a plan view showing a layout structure of a tristate inverter cell, FIG. 4B is a circuit diagram of a tristate inverter, FIG. 5A is a cross-sectional view taken along line Y1-Y1' in FIG. 4A, and FIG. 5B is a cross-sectional view taken along line Y2-Y2' in FIG. 4A.

Local interconnects 61, 62, 63, 64, and 65 extending in the Y direction are formed in a local interconnect layer. The local interconnect 61 is connected with the pads 22a and 24a and also connected with the power line 11 through a via. The local interconnect 62 is connected with the pads 22b and 24b. The local interconnect 63 is connected with the pads 22c, 24c, 27c, and 29c. The local interconnect 64 is connected with the pads 27a and 29a and also connected with the power line 12 through a via. The local interconnect 65 is connected with the pads 27b and 29b.

The gate interconnects 31 and 33 arranged in line in the Y direction are mutually connected through a bridge 37 formed between them. The gate interconnects 32 and 34 arranged in line in the Y direction are not mutually connected but kept separated from each other.

Metal interconnects 71, 72, 73, and 74 extending in the X direction are formed in an M1 interconnect layer. The metal interconnect 71 is connected with the gate interconnect 32 through a via. The metal interconnect 72 is connected with the gate interconnects 31 and 33 through a via. The metal interconnect 73 is connected with the gate interconnect 34 through a via. The metal interconnect 74 is connected with the local interconnect 63 through a via. The metal interconnects 71, 72, 73, and 74 correspond to inputs NE, A, and E and output Y, respectively, of the tristate inverter.

Example 3: Inverter

Figure 6A:
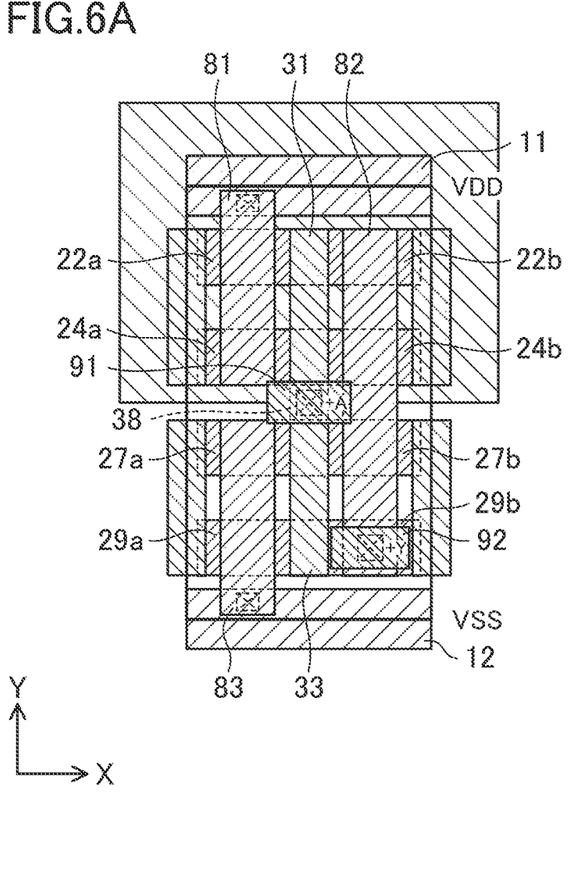
FIG. 6A is a plan view showing a layout structure of an inverter cell.
Figure 6B:
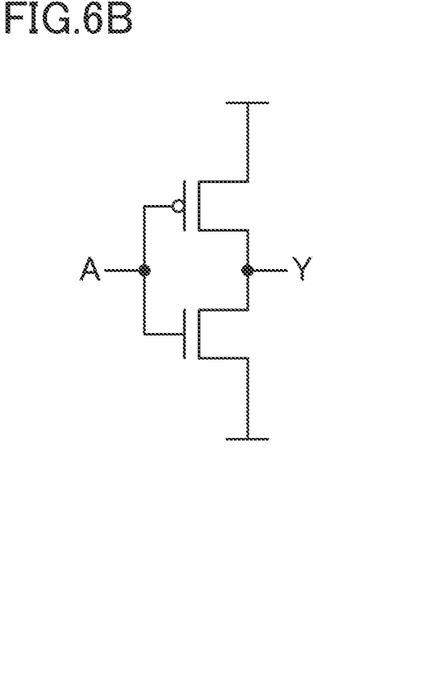
FIG. 6B is a circuit diagram of an inverter.

FIG. 6A is a plan view showing a layout structure of an inverter cell, and FIG. 6B is a circuit diagram of an inverter. This inverter cell is based on a basic structure where only one transistor is placed in the X direction. In this basic structure, assume that only the transistors P11, P12, N11, and N12 in FIGS. 1A-1B are used.

Local interconnects 81, 82, and 83 extending in the Y direction are formed in a local interconnect layer. The local interconnect 81 is connected with the pads 22a and 24a and also connected with the power line 11 through a via. The local interconnect 82 is connected with the pads 22b, 24b, 27b, and 29b. The local interconnect 83 is connected with the pads 27a and 29a and also connected with the power line 12 through a via.

The gate interconnects 31 and 33 arranged in line in the Y direction are mutually connected through a bridge 38 formed between them.

Metal interconnects 91 and 92 extending in the X direction are formed in an M1 interconnect layer. The metal interconnect 91 is connected with the gate interconnects 31 and 33 through a via. The metal interconnect 92 is connected with the local interconnect 82 through a via. The metal interconnects 91 and 92 correspond to input A and output Y, respectively, of the inverter.

Example 4: 2-Input NOR

Figure 7A:
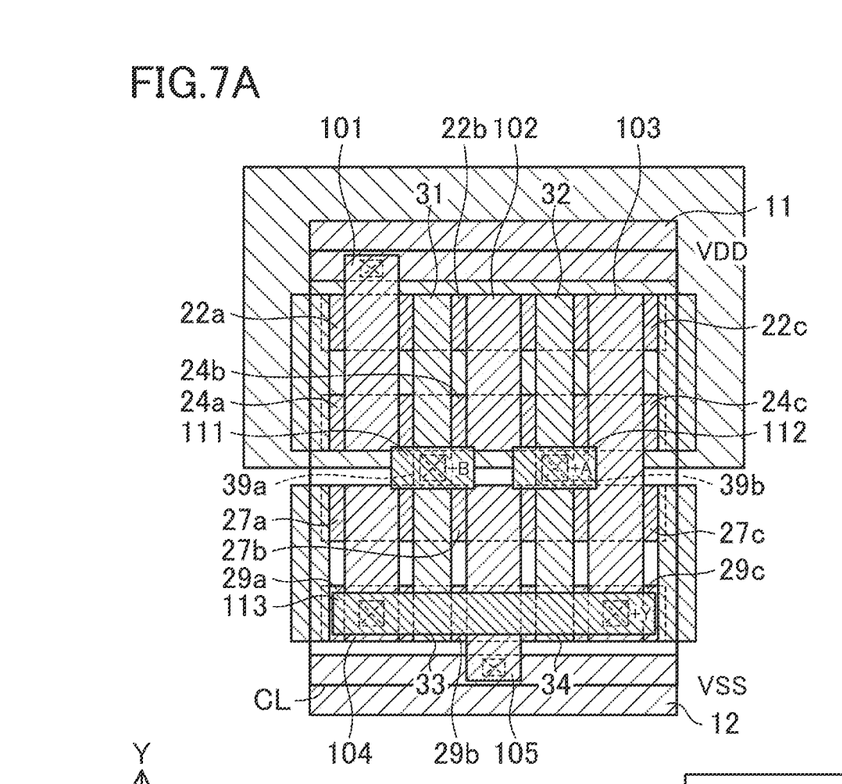
FIG. 7A is a plan view showing a layout structure of a 2-input NOR cell.
Figure 7B:
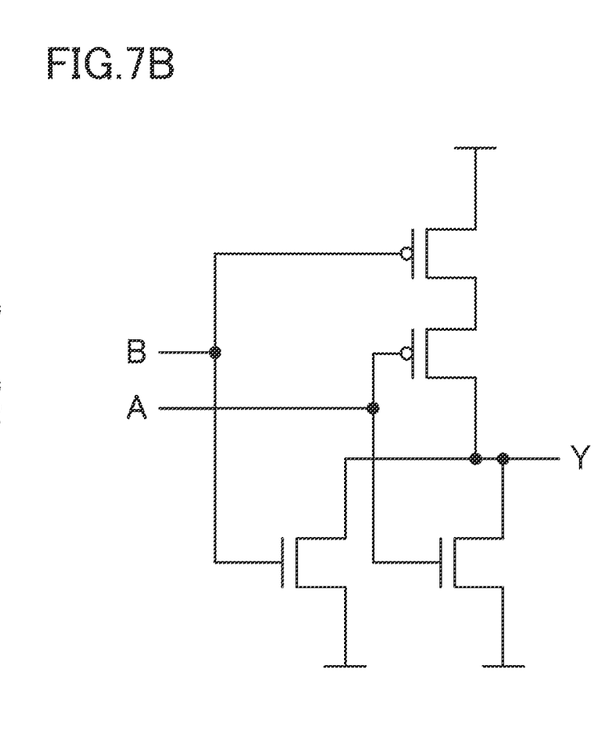
FIG. 7B is a circuit diagram of a 2-input NOR.

FIG. 7A is a plan view showing a layout structure of a 2-input NOR cell, and FIG. 7B is a circuit diagram of a 2-input NOR.

Local interconnects 101, 102, 103, 104, and 105 extending in the Y direction are formed in a local interconnect layer. The local interconnect 101 is connected with the pads 22a and 24a and also connected with the power line 11 through a via. The local interconnect 102 is connected with the pads 22b and 24b. The local interconnect 103 is connected with the pads 22c, 24c, 27c, and 29c. The local interconnect 104 is connected with the pads 27a and 29a. The local interconnect 105 is connected with the pads 27b and 29b and also connected with the power line 12 through a via.

The gate interconnects 31 and 33 arranged in line in the Y direction are mutually connected through a bridge 39a formed between them. The gate interconnects 32 and 34 arranged in line in the Y direction are mutually connected through a bridge 39b formed between them.

Metal interconnects 111, 112, and 113 extending in the X direction are formed in an M1 interconnect layer. The metal interconnect 111 is connected with the gate interconnects 31 and 33 through a via. The metal interconnect 112 is connected with the gate interconnects 32 and 34 through a via. The metal interconnect 113 is connected with the local interconnects 103 and 104 through vias. The metal interconnects 111, 112, and 113 correspond to inputs B and A and output Y, respectively, of the 2-input NOR.

According to this embodiment, in the standard cell having forksheet FETs, the faces of the nanosheets 21a and 21b on the side away from the n-type region in the Y direction are exposed from the gate interconnects 31 and 32. In other words, the gate interconnects 31 and 32 do not protrude from the nanosheets 21a and 21b toward the power line 11 side in the Y direction. Also, the faces of the nanosheets 28a and 28b on the side away from the p-type region in the Y direction are exposed from the gate interconnects 33 and 34. In other words, the gate interconnects 33 and 34 do not protrude from the nanosheets 28a and 28b toward the power line 12 side in the Y direction. Therefore, in the boundary portion between cells adjacent in the Y direction, the space required between nanosheets of one of the cells and nanosheets of the other cell can be smaller.

Also, the faces of the nanosheets 23a and 23b on the side closer to the n-type region in the Y direction are exposed from the gate interconnects 31 and 32. In other words, the gate interconnects 31 and 32 do not protrude from the nanosheets 23a and 23b toward the n-type region. Also, the faces of the nanosheets 26a and 26b on the side closer to the p-type region in the Y direction are exposed from the gate interconnects 33 and 34. In other words, the gate interconnects 33 and 34 do not protrude from the nanosheets 26a and 26b toward the p-type region. Therefore, in the boundary portion between the p-type region and the n-type region, the space required between nanosheets in the p-type region and nanosheets in the n-type region can be smaller.

It is therefore possible to effectively reduce the size in the Y direction of the semiconductor integrated circuit device having forksheet FETs.

(Alteration 1)

Figure 8A:
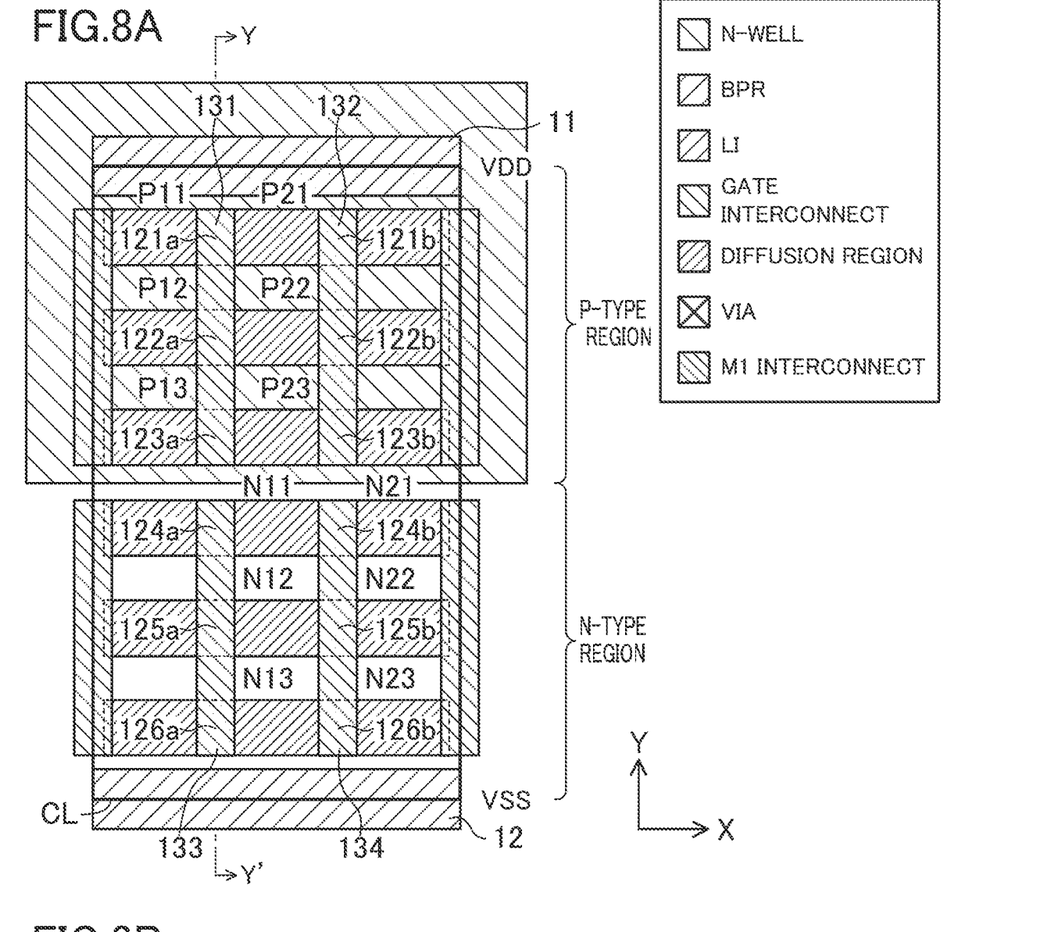
FIGS. 8A and 8B are a plan view and a cross-sectional view, respectively, showing a basic structure of a standard cell having forksheet FETs according to an alteration.
Figure 8B:
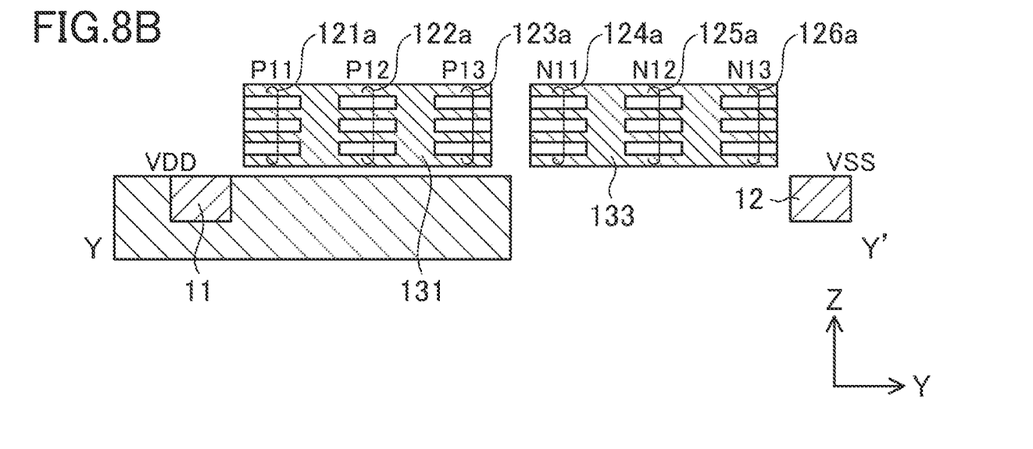

FIGS. 8A-8B are views showing a basic structure of a standard cell having forksheet FETs, where FIG. 8A is a plan view and FIG. 8B is a cross-sectional view taken along line Y-Y' in FIG. 8A.

In the example of FIGS. 8A-8B, transistors are placed in three rows in the Y direction in a p-type region on an N-well, and transistors are placed in three rows in the Y direction in an n-type region on a P-substrate. That is, p-type transistors P11, P12, P13, P21, P22, and P23 are formed in the p-type region, and n-type transistors N11, N12, N13, N21, N22, and N23 are formed in the n-type region. The transistors P11, P12, P13, N11, N12, and N13 are arranged in line in the Y direction, and the transistors P21, P22, P23, N21, N22, and N23 are arranged in line in the Y direction.

The transistors P11, P12, P13, P21, P22, and P23 have nanosheets 121a, 122a, 123a, 121b, 122b, and 123b, respectively, each made of three sheets, as their channel portions. The transistors N11, N12, N13, N21, N22, and N23 have nanosheets 124a, 125a, 126a, 124b, 125b, and 126b, respectively, each made of three sheets, as their channel portions.

Gate interconnects 131 and 132 extending in parallel in the Y direction are formed in the p-type region. The gate interconnect 131 surrounds the peripheries of the nanosheets 121a of the transistor P11, the nanosheets 122a of the transistor P12, and the nanosheets 123a of the transistor P13 in the Y and Z directions via a gate insulating film (not shown). The gate interconnect 131 is to be the gates of the transistors P11, P12, and P13. The gate interconnect 132 surrounds the peripheries of the nanosheets 121b of the transistor P21, the nanosheets 122b of the transistor P22, and the nanosheets 123b of the transistor P23 in the Y and Z directions via a gate insulating film (not shown). The gate interconnect 132 is to be the gates of the transistors P21, P22, and P23.

Gate interconnects 133 and 134 extending in parallel in the Y direction are formed in the n-type region. The gate interconnect 133 surrounds the peripheries of the nanosheets 124a of the transistor N11, the nanosheets 125a of the transistor N12, and the nanosheets 126a of the transistor N13 in the Y and Z directions via a gate insulating film (not shown). The gate interconnect 133 is to be the gates of the transistors N11, N12, and N13. The gate interconnect 134 surrounds the peripheries of the nanosheets 124b of the transistor N21, the nanosheets 125b of the transistor N22, and the nanosheets 126b of the transistor N23 in the Y and Z directions via a gate insulating film (not shown). The gate interconnect 134 is to be the gates of the transistors N21, N22, and N23.

Here, the faces of the nanosheets 121a and 121b on the side away from the n-type region in the Y direction (the side closer to the power line 11) are exposed, not covered with the gate interconnects 131 and 132. The faces of the nanosheets 123a and 123b on the side closer to the n-type region in the Y direction are exposed, not covered with the gate interconnects 131 and 132. For example, the nanosheets 121a, 122a, and 123a constitute the first nanosheet group, in which the nanosheets 121a correspond to the first nanosheet farthest from the n-type region and the nanosheets 123a correspond to the second nanosheet closest to the n-type region.

Also, the faces of the nanosheets 124a and 124b on the side closer to the p-type region in the Y direction are exposed, not covered with the gate interconnects 133 and 134. The faces of the nanosheets 126a and 126b on the side away from the p-type region in the Y direction (the side closer to the power line 12) are exposed, not covered with the gate interconnects 133 and 134. For example, the nanosheets 124a, 125a, and 126a constitute the second nanosheet group, in which the nanosheets 126a correspond to the third nanosheet farthest from the p-type region and the nanosheets 124a correspond to the fourth nanosheet closest to the p-type region.

The nanosheets 122a and 122b are entirely surrounded by the gate interconnects 131 and 132, and the nanosheets 125a and 125b are entirely surrounded by the gate interconnects 133 and 134.

In this alteration, also, similar effects to those obtained in the above embodiment are obtained. That is, in the boundary portion between cells adjacent in the Y direction, the space required between nanosheets of one of the cells and nanosheets of the other cell can be smaller. Also, in the boundary portion between the p-type region and the n-type region, the space required between nanosheets in the p-type region and nanosheets in the n-type region can be smaller. It is therefore possible to effectively reduce the size in the Y direction of the semiconductor integrated circuit device having forksheet FETs.

(Alteration 2)

Figure 9A:
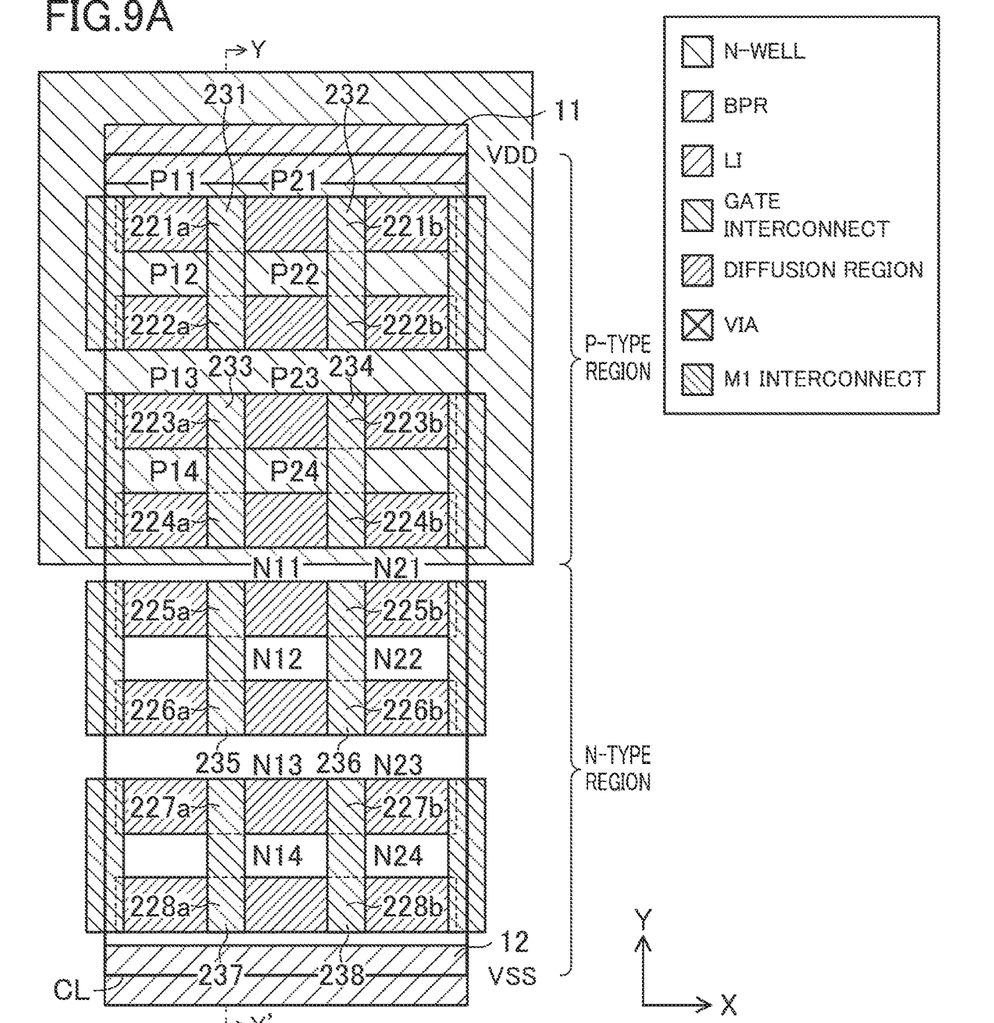
FIGS. 9A and 9B are a plan view and a cross-sectional view, respectively, showing a basic structure of a standard cell having forksheet FETs according to another alteration.
Figure 9B:
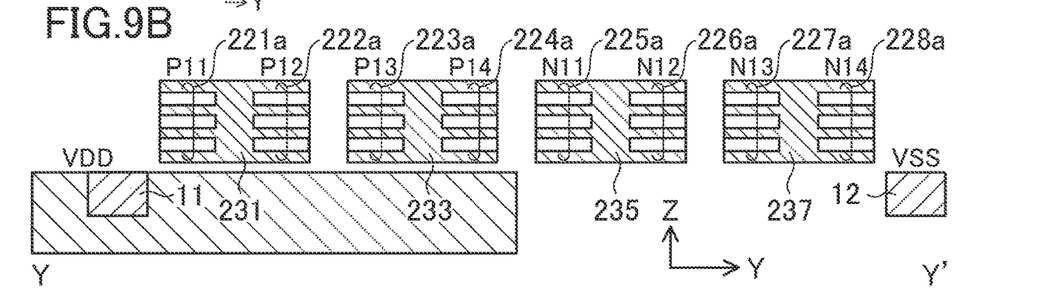

FIGS. 9A-9B are views showing a basic structure of a standard cell having forksheet FETs, where FIG. 9A is a plan view and FIG. 9B is a cross-sectional view taken along line Y-Y' in FIG. 9A.

In the example of FIGS. 9A-9B, transistors are placed in four rows in the Y direction in a p-type region on an N-well, and transistors are placed in four rows in the Y direction in an n-type region on a P-substrate. That is, p-type transistors P11, P12, P13, P14, P21, P22, P23, and P24 are formed in the p-type region, and n-type transistors N11, N12, N13, N14, N21, N22, N23, and N24 are formed in the n-type region. The transistors P11, P12, P13, P14, N11, N12, N13, and N14 are arranged in line in the Y direction, and the transistors P21, P22, P23, P24, N21, N22, N23, and N24 are arranged in line in the Y direction.

The transistors P11, P12, P13, P14, P21, P22, P23, and P24 have nanosheets 221a, 222a, 223a, 224a, 221b, 222b, 223b, and 224b, respectively, each made of three sheets, as their channel portions. The transistors N11, N12, N13, N14, N21, N22, N23, and N24 have nanosheets 225a, 226a, 227a, 228a, 225b, 226b, 227b, and 228b, respectively, each made of three sheets, as their channel portions.

Gate interconnects 231 and 232 extending in parallel in the Y direction are formed in the p-type region. The gate interconnect 231 surrounds the peripheries of the nanosheets 221a of the transistor P11 and the nanosheets 222a of the transistor P12 in the Y and Z directions via a gate insulating film (not shown). The gate interconnect 231 is to be the gates of the transistors P11 and P12. The gate interconnect 232 surrounds the peripheries of the nanosheets 221b of the transistor P21 and the nanosheets 222b of the transistor P22 in the Y and Z directions via a gate insulating film (not shown). The gate interconnect 232 is to be the gates of the transistors P21 and P22.

Also, gate interconnects 233 and 234 extending in parallel in the Y direction are formed in the p-type region. The gate interconnect 233 is at the same position in the X direction as the gate interconnect 231, and the gate interconnect 234 is at the same position in the X direction as the gate interconnect 232. The gate interconnect 233 surrounds the peripheries of the nanosheets 223a of the transistor P13 and the nanosheets 224a of the transistor P14 in the Y and Z directions via a gate insulating film (not shown). The gate interconnect 233 is to be the gates of the transistors P13 and P14. The gate interconnect 234 surrounds the peripheries of the nanosheets 223b of the transistor P23 and the nanosheets 224b of the transistor P24 in the Y and Z directions via a gate insulating film (not shown). The gate interconnect 234 is to be the gates of the transistors P23 and P24.

Gate interconnects 235 and 236 extending in parallel in the Y direction are formed in the n-type region. The gate interconnect 235 surrounds the peripheries of the nanosheets 225a of the transistor N11 and the nanosheets 226a of the transistor N12 in the Y and Z directions via a gate insulating film (not shown). The gate interconnect 235 is to be the gates of the transistors N11 and N12. The gate interconnect 236 surrounds the peripheries of the nanosheets 225b of the transistor N21 and the nanosheets 226b of the transistor N22 in the Y and Z directions via a gate insulating film (not shown). The gate interconnect 236 is to be the gates of the transistors N21 and N22.

Also, gate interconnects 237 and 238 extending in parallel in the Y direction are formed in the n-type region. The gate interconnect 237 is at the same position in the X direction as the gate interconnect 235, and the gate interconnect 238 is at the same position in the X direction as the gate interconnect 236. The gate interconnect 237 surrounds the peripheries of the nanosheets 227a of the transistor N13 and the nanosheets 228a of the transistor N14 in the Y and Z directions via a gate insulating film (not shown). The gate interconnect 237 is to be the gates of the transistors N13 and N14. The gate interconnect 238 surrounds the peripheries of the nanosheets 227b of the transistor N23 and the nanosheets 228b of the transistor N24 in the Y and Z directions via a gate insulating film (not shown). The gate interconnect 238 is to be the gates of the transistors N23 and N24.

Here, the faces of the nanosheets 221a and 221b on the side away from the n-type region in the Y direction (the side closer to the power line 11) are exposed, not covered with the gate interconnects 231 and 232. The faces of the nanosheets 224a and 224b on the side closer to the n-type region in the Y direction are exposed, not covered with the gate interconnects 233 and 234. For example, the nanosheets 221a, 222a, 223a, and 224a constitute the first nanosheet group, in which the nanosheets 221a correspond to the first nanosheet farthest from the n-type region and the nanosheets 224a correspond to the second nanosheet closest to the n-type region. The gate interconnects 231 and 233 correspond to the first gate interconnect, although in this alteration, the first gate interconnect is separated into two at a position between the nanosheets 222a and 223a.

Also, the faces of the nanosheets 225a and 225b on the side closer to the p-type region in the Y direction are exposed, not covered with the gate interconnects 235 and 236. The faces of the nanosheets 228a and 228b on the side away from the n-type region in the Y direction (the side closer to the power line 12) are exposed, not covered with the gate interconnects 237 and 238. For example, the nanosheets 225a, 226a, 227a, and 228a constitute the second nanosheet group, in which the nanosheets 228a correspond to the third nanosheet farthest from the p-type region and the nanosheets 225a correspond to the fourth nanosheet closest to the p-type region. The gate interconnects 235 and 237 correspond to the second gate interconnect, although in this alteration, the second gate interconnect is separated into two at a position between the nanosheets 226a and 227a.

In this alteration, also, similar effects to those obtained in the above embodiment are obtained. That is, in the boundary portion between cells adjacent in the Y direction, the space required between nanosheets of one of the cells and nanosheets of the other cell can be smaller. Also, in the boundary portion between the p-type region and the n-type region, the space required between nanosheets in the p-type region and nanosheets in the n-type region can be smaller. It is therefore possible to effectively reduce the size in the Y direction of the semiconductor integrated circuit device having forksheet FETs.

Moreover, in this alteration, the faces of the nanosheets 222a and 222b on the side opposed to the nanosheets 223a and 223b are exposed, not covered with the gate interconnects 231 and 232. The faces of the nanosheets 223a and 223b on the side opposed to the nanosheets 222a and 222b are exposed, not covered with the gate interconnects 233 and 234. For example, the nanosheets 222a and 223a correspond to the fifth and sixth nanosheets adjacent to each other in the Y direction lying between the first and second nanosheets in the first nanosheet group.

Also, the faces of the nanosheets 226a and 226b on the side opposed to the nanosheets 227a and 227b are exposed, not covered with the gate interconnects 235 and 236. The faces of the nanosheets 227a and 227b on the side opposed to the nanosheets 226a and 226b are exposed, not covered with the gate interconnects 237 and 238. For example, the nanosheets 226a and 227a correspond to the seventh and eighth nanosheets adjacent to each other in the Y direction lying between the third and fourth nanosheets in the second nanosheet group.

With the configuration described above, since the gate interconnects 231 and 233 are separated, different signals can be supplied to the gates between the transistors P11 and P12 and the transistors P13 and P14. Since the gate interconnects 232 and 234 are separated, different signals can be supplied to the gates between the transistors P21 and P22 and the transistors P23 and P24. Also, since the gate interconnects 235 and 237 are separated, different signals can be supplied to the gates between the transistors N11 and N12 and the transistors N13 and N14. Since the gate interconnects 236 and 238 are separated, different signals can be supplied to the gates between the transistors N21 and N22 and the transistors N23 and N24. This enhances the degree of freedom of configurable logical circuits.

In addition, only small space is required between the transistors P12 and P22 and the transistors P13 and P23, i.e., between the nanosheets 222a and 222b and the nanosheets 223a and 223b. Also, only small space is required between the transistors N12 and N22 and the transistors N13 and N23, i.e., between the nanosheets 226a and 226b and the nanosheets 227a and 227b. It is therefore possible to further effectively reduce the size in the Y direction of the semiconductor integrated circuit device having forksheet FETs.

In the configuration of FIGS. 9A-9B, it is acceptable to form the gate interconnects 231 and 233, the gate interconnects 232 and 234, the gate interconnects 235 and 237, and the gate interconnects 236 and 238 as respective integral interconnects, not separated.

According to the present disclosure, a small-area layout structure can be achieved for a semiconductor integrated circuit device using forksheet FETs. The present disclosure is therefore useful for downsizing and improved integrity of semiconductor chips.

What is claimed is:

1. A semiconductor integrated circuit device including standard cells arranged in a first direction,
   in each of the standard cells, a p-type region in which p-type transistors are formed and an n-type region in which n-type transistors are formed being disposed adjacently in a second direction vertical to the first direction, the standard cell comprising:
   a first nanosheet group including two or more nanosheets, each extending in the first direction, arranged in the second direction in the p-type region;
   a second nanosheet group including two or more nanosheets, each extending in the first direction, arranged in the second direction in the n-type region;
   a first gate interconnect extending in the second direction, formed to surround peripheries of the nanosheets of the first nanosheet group in the second direction and a third direction perpendicular to the first and second directions; and
   a second gate interconnect extending in the second direction, formed to surround peripheries of the nanosheets of the second nanosheet group in the second and third directions,
   wherein
   in the first nanosheet group, a first nanosheet farthest from the n-type region has a face exposed from the first gate interconnect on a side away from the n-type region in the second direction, and a second nanosheet closest to the n-type region has a face exposed from the first gate interconnect on a side closer to the n-type region in the second direction, and
   in the second nanosheet group, a third nanosheet farthest from the p-type region has a face exposed from the second gate interconnect on a side away from the p-type region in the second direction, and a fourth nanosheet closest to the p-type region has a face exposed from the second gate interconnect on a side closer to the p-type region in the second direction.

2. The semiconductor integrated circuit device of claim 1, wherein
   each of the nanosheets of the first and second nanosheet groups has a one-sheet structure or a sheet structure of a plurality of nanosheets overlapping as viewed in plan.

3. The semiconductor integrated circuit device of claim 1, wherein
   the first and second gate interconnects are placed at a same position in the first direction.

4. The semiconductor integrated circuit device of claim 3, wherein
   the standard cell further comprises a gate connecting portion formed between the first and second gate interconnects for connecting the first and second gate interconnects.

5. The semiconductor integrated circuit device of claim 1, wherein
   the first nanosheet group includes fifth and sixth nanosheets adjacent to each other in the second direction, lying between the first and second nanosheets, the second nanosheet group includes seventh and eighth nanosheets adjacent to each other in the second direction, lying between the third and fourth nanosheets, faces of the fifth and sixth nanosheets opposed to each other in the second direction are exposed from the first gate interconnect, and faces of the seventh and eighth nanosheets opposed to each other in the second direction are exposed from the second gate interconnect.

6. The semiconductor integrated circuit device of claim 1, further comprising:

a first power line extending in the first direction for supplying a first power supply voltage; and a second power line extending in the first direction for supplying a second power supply voltage, wherein the p-type region and the n-type region are formed between the first and second power lines.

7. A semiconductor integrated circuit device, comprising:

a first power line extending in a first direction for supplying a first power supply voltage; and a second power line extending in the first direction for supplying a second power supply voltage, a p-type region in which p-type transistors are formed and an n-type region in which n-type transistors are formed being disposed adjacently in a second direction vertical to the first direction between the first and second power lines, the device further comprising:

a first nanosheet group including two or more nanosheets, each extending in the first direction, arranged in the second direction in the p-type region;

a second nanosheet group including two or more nanosheets, each extending in the first direction, arranged in the second direction in the n-type region;

a first gate interconnect extending in the second direction, formed to surround peripheries of the nanosheets of the first nanosheet group in the second direction and a third direction perpendicular to the first and second directions; and a second gate interconnect extending in the second direction, formed to surround peripheries of the nanosheets of the second nanosheet group in the second and third directions, wherein in the first nanosheet group, a first nanosheet farthest from the n-type region has a face exposed from the first gate interconnect on a side away from the n-type region in the second direction, and a second nanosheet closest to the n-type region has a face exposed from the first gate interconnect on a side closer to the n-type region in the second direction, and in the second nanosheet group, a third nanosheet farthest from the p-type region has a face exposed from the second gate interconnect on a side away from the p-type region in the second direction, and a fourth nanosheet closest to the p-type region has a face exposed from the second gate interconnect on a side closer to the p-type region in the second direction.

* * * * *